United States Patent
Sawada

(10) Patent No.: US 9,245,999 B2
(45) Date of Patent: Jan. 26, 2016

(54) SEMICONDUCTOR DEVICE

(71) Applicant: Tomonari Sawada, Toyota (JP)

(72) Inventor: Tomonari Sawada, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/085,259

(22) Filed: Nov. 20, 2013

(65) Prior Publication Data

US 2014/0159147 A1    Jun. 12, 2014

(30) Foreign Application Priority Data

Dec. 7, 2012  (JP) ................. 2012-268293

(51) Int. Cl.
*H01L 29/66* (2006.01)
*H01L 29/78* (2006.01)
*H01L 29/49* (2006.01)
*H01L 29/739* (2006.01)
*H01L 29/06* (2006.01)
*H01L 29/40* (2006.01)
*H01L 29/423* (2006.01)

(52) U.S. Cl.
CPC ........ *H01L 29/7827* (2013.01); *H01L 29/0634* (2013.01); *H01L 29/407* (2013.01); *H01L 29/4916* (2013.01); *H01L 29/4925* (2013.01); *H01L 29/7397* (2013.01); *H01L 29/4236* (2013.01)

(58) Field of Classification Search
CPC ............ H01L 29/7813; H01L 29/4236; H01L 29/66734; H01L 29/7825; H01L 28/91; H01L 29/78; H01L 29/407; H01L 29/4916; H01L 29/7397; H01L 29/0634; H01L 21/2652; H01L 29/0847; H01L 29/66348
See application file for complete search history.

(56) References Cited

U.S. PATENT DOCUMENTS

2012/0187474 A1*   7/2012   Rexer et al. ................... 257/330

FOREIGN PATENT DOCUMENTS

| JP | 2000-138370 A | 5/2000 |
| JP | A-2001-156288 | 6/2001 |
| JP | 2004-514293 A | 5/2004 |
| JP | A-2009-94484 | 4/2009 |
| WO | 02/41404 A2 | 5/2002 |

* cited by examiner

*Primary Examiner* — Su C Kim
*Assistant Examiner* — Junaiden Mirsalahuddin
(74) *Attorney, Agent, or Firm* — Oliff PLC

(57) ABSTRACT

A semiconductor device includes: a semiconductor substrate having a drift layer of a first conductivity type, a body layer of a second conductivity type formed on a surface of the drift layer, and a source layer formed on a portion of a surface of the body layer; a gate insulation film formed on an inner wall of a trench that extends from the surface of the semiconductor substrate through the source layer and the body layer to the drift layer; and a gate electrode housed in the trench and covered with the gate insulation film, the gate electrode including, in a region located at a drift layer side of a boundary between the body and drift layers, at least one first semiconductor layer of the first conductivity type and at least one second semiconductor layer of the second conductivity type that are alternately disposed and joined to each other.

4 Claims, 6 Drawing Sheets

US 9,245,999 B2

SEMICONDUCTOR DEVICE

INCORPORATION BY REFERENCE

The disclosure of Japanese Patent Application No. 2012-268293 filed on Dec. 7, 2012 including the specification, drawings and abstract is incorporated herein by reference in its entirety.

BACKGROUND OF THE INVENTION

1. Field of the Invention

The invention relates to a semiconductor device.

2. Description of Related Art

In order to make a trench gate type semiconductor device capable of withstanding high voltage, a thick insulation film is formed in a bottom portion of a trench in Japanese Patent Application Publication No. 2009-94484 (JP 2009-94484 A). This thick insulation film restrains leakage current, so that the semiconductor device becomes capable of withstanding high voltage.

In JP 2009-94484 A, a corner portion in a lower end of the gate electrode and a semiconductor substrate are isolated from each other by a relatively thin insulation film, similarly to a side surface of the trench. The insulation film is formed by oxidation of a semiconductor substrate, and, in the corner portion, the proportion of the semiconductor substrate oxidized is small. Therefore, in some cases, the insulation film does not sufficiently grow in the corner portion in the lower end of the gate electrode, which becomes a cause of an increase in the leakage current of the semiconductor device or a decline in the withstanding voltage of the semiconductor device.

SUMMARY OF THE INVENTION

A semiconductor device in accordance with an aspect of the invention includes: a semiconductor substrate having a drift layer of a first conductivity type, a body layer of a second conductivity type formed on a surface of the drift layer, and a source layer formed on a portion of a surface of the body layer; a gate insulation film formed on an inner wall of a trench that extends from the surface of the semiconductor substrate through the source layer and the body layer to the drift layer; and a gate electrode housed in the trench and covered with the gate insulation film, the gate electrode including, in a region located at a drift layer side of a boundary between the body layer and the drift layer, at least one first semiconductor layer of the first conductivity type and at least one second semiconductor layer of the second conductivity type that are alternately disposed and joined to each other.

According to the foregoing semiconductor device, when the gate electrode is on, depletion layers spread from junction surfaces between the first conductivity type first semiconductor layers and the second conductivity type second semiconductor layers in the region in the gate electrode which is located at the drift layer side of the boundary between the body layer and the drift layer. Therefore, there is no need to form a thick insulation film in a bottom portion of the trench, so that imperfect formation of an insulation film is restrained. In consequence, leakage current is restrained, and a withstanding voltage is secured. Furthermore, increase in gate capacitance in the bottom portion of the trench gate can be restrained, and increase in switching loss can be avoided.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

First Embodiment

Figure 1:
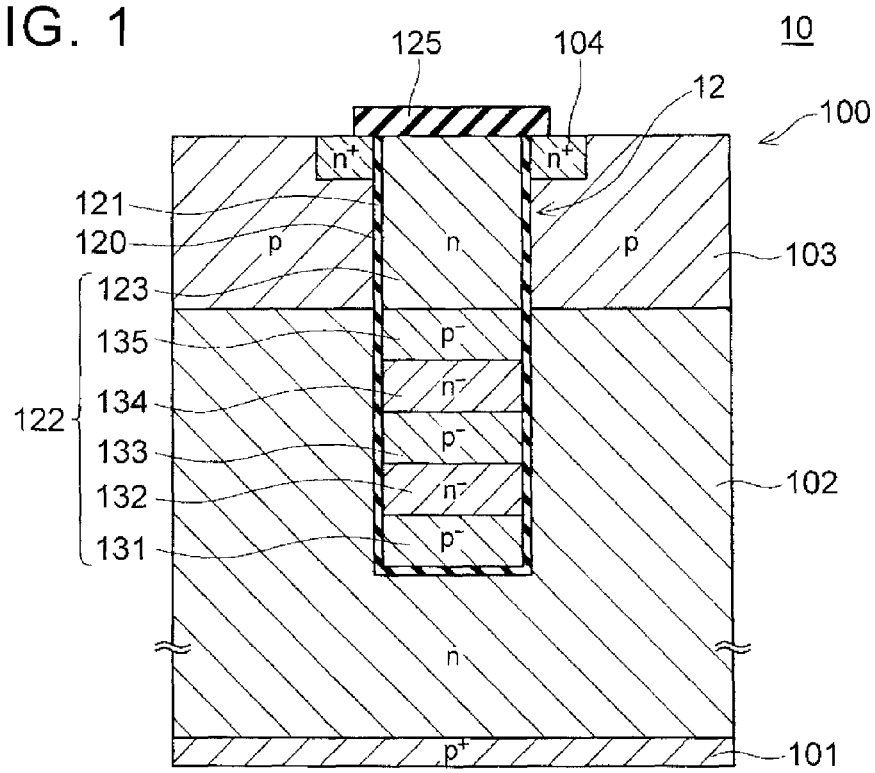
FIG. 1 is a sectional view of a semiconductor device in accordance with a first embodiment of the invention.

A semiconductor device 10 in accordance with this embodiment, as shown in FIG. 1, includes a semiconductor substrate 100, a trench gate 12 and a surface insulation film 125.

The semiconductor substrate 100 includes a p-type collector layer 101, an n-type drift layer 102, a p-type body layer 103 and an n-type emitter layer (source layer) 104. The body layer 103 is in contact with an obverse surface of the drift layer 102. The emitter layer 104 is provided on a portion of an obverse surface of the body layer 103, and is exposed on an obverse surface of the semiconductor substrate 100, and is separated from the drift layer 102 by the body layer 103. The collector layer 101 is in contact with a reverse surface of the drift layer 102, and is exposed on a reverse surface of the semiconductor substrate 100.

The trench gate 12 includes a trench 120 that extends from the obverse surface of the semiconductor substrate 100 through the body layer 103 into the drift layer 102, a gate insulation film 121 fainted on an inner wall surface of the trench 120, and a gate electrode 122 housed in the trench 120 and covered with the gate insulation film 121. The gate electrode 122 includes p-layers 131, 133 and 135 whose material is a polysilicon of the p-type, and n-layers 123, 132 and 134 whose material is a polysilicon of the n-type. The p-layer 131, the n-layer 132, the p-layer 133, the n-layer 134, the p-layer 135 and the n-layer 123 are layered in this order from the drift layer 102 side toward the emitter layer 104 side in the semiconductor substrate 100. The n-layer 123 is provided in a region extending from the obverse surface of the semiconductor substrate 100 to a boundary between the body layer 103 and the drift layer 102. The p-layers 131, 133 and 135 and the n-layers 132 and 134 are provided in a region located at the drift layer 102 side of the boundary between the body layer 103 and the drift layer 102. The p-layers 131, 133 and 135 and the n-layers 132 and 134 are lower in impurity concentration than the n-layer 123.

When the gate voltage is off, depletion layers spread from pn junction surfaces between the p-layer 131 and the n-layer 132, between the n-layer 132 and the p-layer 133, between the p-layer 133 and the n-layer 134, between the n-layer 134 and the p-layer 135 and between the p-layer 135 and the n-layer 123. The width $x_p$ of a depletion layer in a semiconductor layer of the p-type and the width $x_n$ of the depletion layer in a semiconductor layer of the n-type can be expressed by the following expressions (1) and (2).

$$x_n = \sqrt{\frac{2\varepsilon N_a}{qN_d(N_d + N_a)}\Phi_B} \quad (1)$$

$$x_p = \sqrt{\frac{2\varepsilon N_d}{qN_a(N_d + N_a)}\Phi_B} \quad (2)$$

In the foregoing expressions, $N_a$ is the p-type impurity concentration in the semiconductor layer of the p-type, $N_d$ is the n-type impurity concentration in the semiconductor layer of the n-type, and $\Phi_B$ is the built-in electric potential. On the basis of the expressions (1) and (2), the impurity concentrations in the p-layers 131, 133 and 135 and the n-layers 132 and 134 are set so that when the gate voltage is on, a portion of the gate electrode 122 which extends from the p-layer 135, including the p-layer 135, to the drift layer 102 side entirely becomes depleted of carriers. Because this depletion layer functions as an insulation layer, the semiconductor device 10 is low in leakage current and high in withstanding voltage. Furthermore, unlike a related-art in which a thick insulation film is formed in a bottom portion of a trench, the gate insulation film 121 does not become thin in a corner portion of the lower end of the gate electrode 122, so that electric breakdown in the corner portions of the gate insulation film 121 can be prevented and leakage current can be restrained. Furthermore, when the gate voltage is on, the p-layers 131, 133 and 135 and the n-layers 132 and 134 become depleted of carries and therefore do not contribute to the gate capacitance, so that increase in the switching loss can be avoided.

As stated above, the semiconductor device 10 has the semiconductor substrate 100 that includes the n-type drift layer 102 and the p-type body layer 103 formed on the obverse surface of the drift layer 102, and the trench gate 12 that extends from the obverse surface of the semiconductor substrate 100 through the source layer (emitter layer) 104 and the body layer 103 into the drift layer 102. The trench gate 12 includes the trench 120 formed in the semiconductor substrate 100, the gate insulation film 121 formed on the inner wall surface of the trench 120, and the gate electrode 122 housed in the trench 120 and covered with the gate insulation film 121. The region in the gate electrode 122 which is located at the drift layer 102 side of the boundary between the body layer 103 and the drift layer 102 includes the n-type semiconductor layers and the p-type semiconductor layers that are alternately disposed and joined to each other. According to the semiconductor device 10, when the gate electrode 122 is on, depletion layers spread from the junction surfaces between the n-type semiconductor layers and the p-type semiconductor layers in the region in the gate electrode 122 which is located at the drift layer 102 side of the boundary between the body layer 103 and the drift layer 102. Therefore, the gate capacitance on a bottom surface of the trench gate 12 is restrained, and increased switching loss can be avoided. Furthermore, according to the semiconductor device 10, imperfect formation of the gate insulation film 121 in a corner portion in the bottom portion of the trench 120 can be restrained. In consequence, leakage current is restrained, and a withstanding voltage is secured.

(Modifications)

Figure 2:
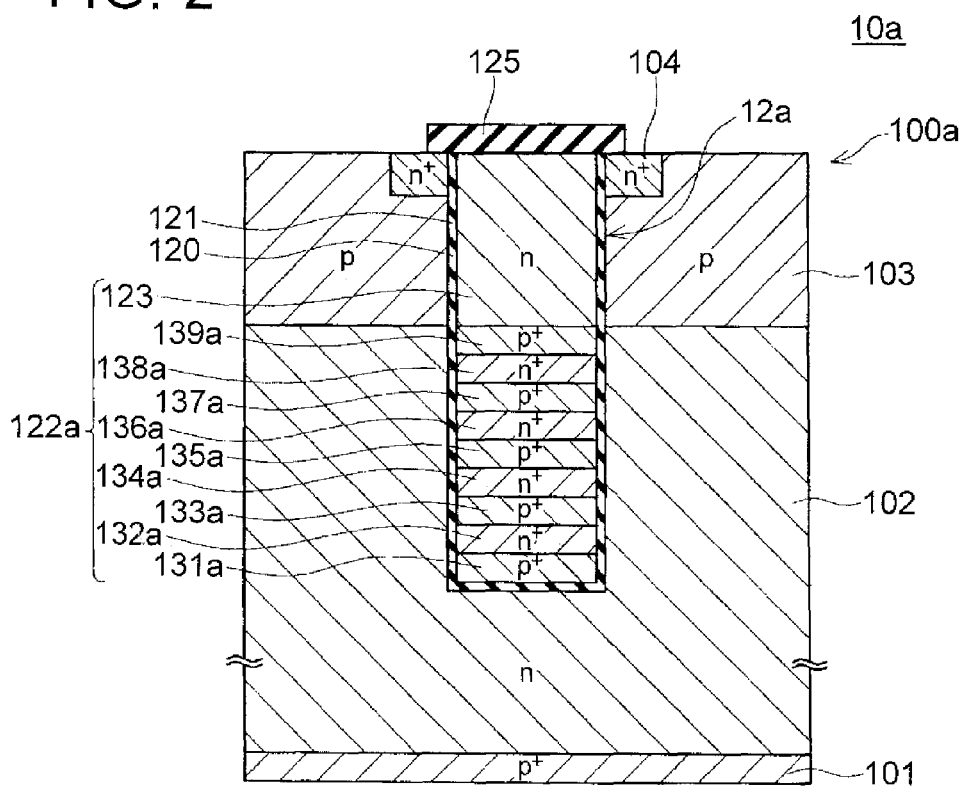
FIG. 2 is a sectional view of a semiconductor device in accordance with a modification in the invention.

The configuration of the region in the gate electrode which is located at the drift layer side of the boundary between the drift layer and the body layer is not limited to the configuration shown in FIG. 1. For example, as in a trench gate 12a of a semiconductor device 10a shown in FIG. 2, it is also permissible that, in a region located at the drift layer 102 side of the boundary between the body layer 103 and the drift layer 102 in a semiconductor substrate 100a, there be provided a gate electrode 122a in which p-layers 131a, 133a, 135a, 137a and 139a that are higher in p-type impurity concentration than the body layer 103, and n-layers 132a, 134a, 136a and 138a that are higher in n-type impurity concentration than the n-layer 123 are alternately layered.

Figure 3:
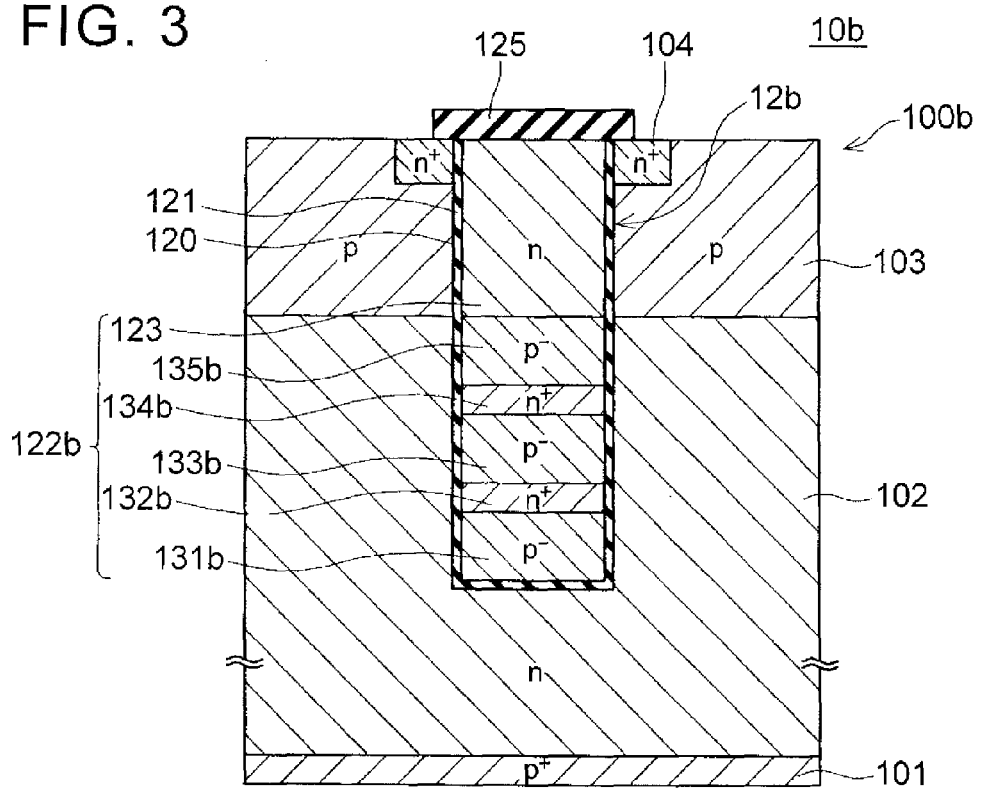
FIG. 3 is a sectional view of a semiconductor device in accordance with a modification in the invention.

Furthermore, as in a trench gate 12b of a semiconductor device 10b shown in FIG. 3, it is also permissible that, in a region located at the drift layer 102 side of the boundary between the body layer 103 and the drift layer 102 in a semiconductor substrate 100b, there be provided a gate electrode 122b in which p-layers 131b, 133b and 135b that are lower in impurity concentration than the n-layer 123, and n-layers 132b and 134b that are higher in impurity concentration than the n-layer 123 are alternately layered. In this case, it is preferable that the high-impurity concentration n-layers 132b and 134b be smaller in thickness than the low-impurity concentration p-layers 131b, 133b and 135b.

Figure 4:
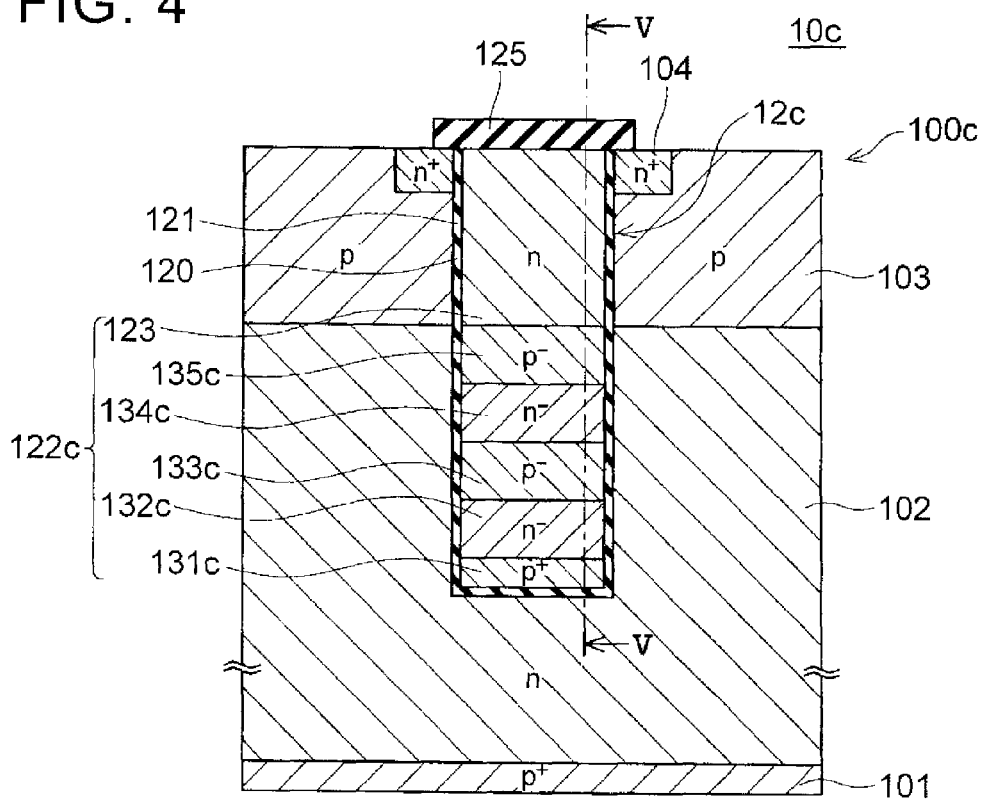
FIG. 4 is a sectional view of a semiconductor device in accordance with a modification in the invention.
Figure 5:
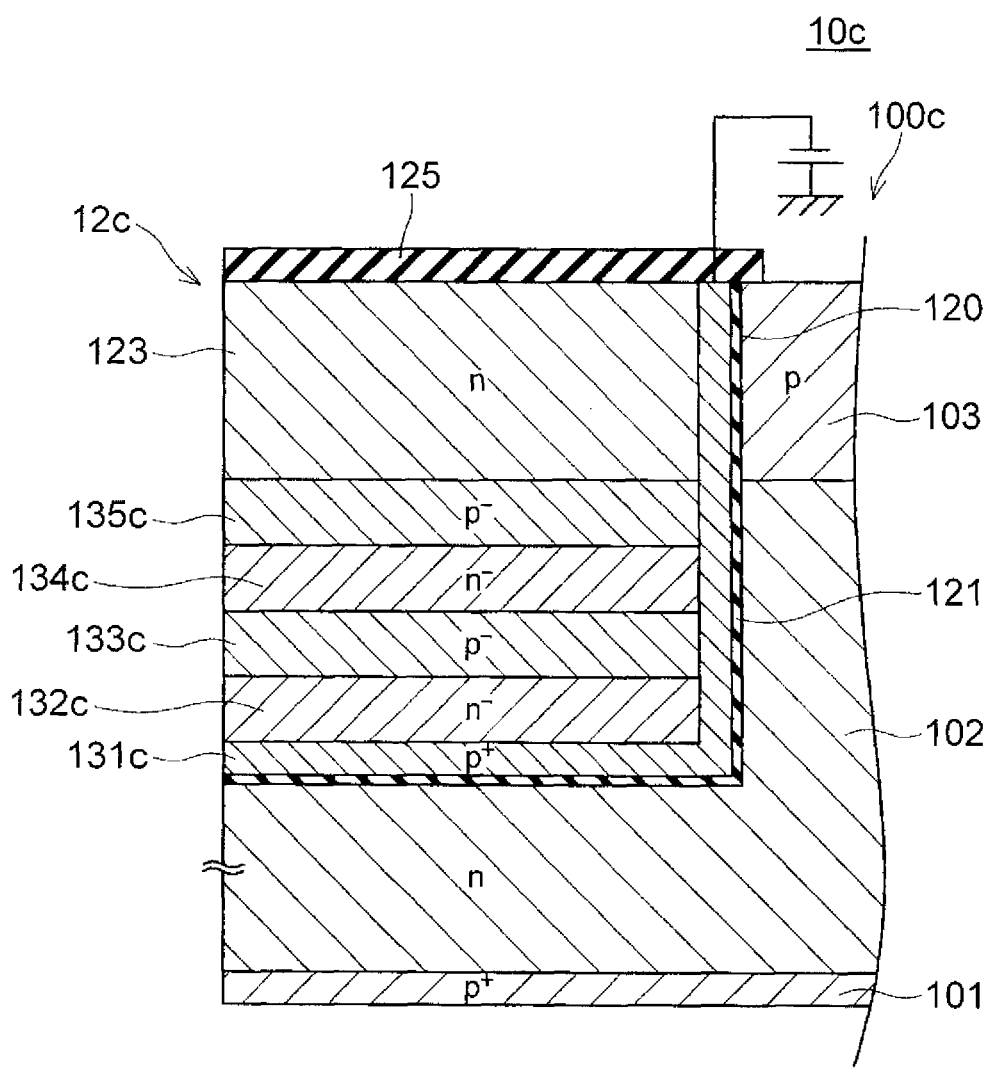
FIG. 5 is a sectional view of a semiconductor device in accordance with a modification in the invention.

Furthermore, as in a trench gate 12c of a semiconductor device 10c shown in FIGS. 4 and 5, it is permissible that, in a gate electrode 122c in which p-layers 131c, 133c and 135c and n-layers 132c, 134c and 123 are alternately layered, bias voltage be able to be applied between the n-layer 123 and the p-layer 131c. The p-layer 131c is formed along a bottom of the trench 120, and, in an end portion of the trench 120, extends in the depth direction of the semiconductor substrate 100c along a wall surface of the trench 120, and reaches an obverse surface of a semiconductor substrate 100c. The p-layer 131c is connected to a wiring at a portion of the p-layer 131c which is exposed on the obverse surface of the semiconductor substrate 100c, and is given a negative electric potential. Therefore, reverse bias voltage can be applied between upper and lower ends of the gate electrode 122c. Incidentally, in the case where an n-layer is disposed in a lowermost bottom portion of the trench 120, a reverse bias voltage is applied to the n-layer by giving a positive electric potential thereto.

The width $x_p$ of the depletion layer in a semiconductor layer of the p-type and the width $x_n$ of the depletion layer in a semiconductor layer of the n-type can be expressed by the following expressions (3) and (4), where $V_b$ is the reverse bias voltage applied to the gate electrode 122c.

$$x_n = \sqrt{\frac{2\varepsilon N_a}{qN_d(N_d + N_a)}(\Phi_B - V_b)} \quad (3)$$

$$x_p = \sqrt{\frac{2\varepsilon N_d}{qN_a(N_d + N_a)}(\Phi_B - V_b)} \quad (4)$$

That is, as the absolute value of the reverse bias voltage applied to the gate electrode 122c is greater, the widths $X_p$ and $X_n$ of the depletion layer are greater and therefore the number of p-layers and n-layers to be layered can be more reduced.

Figure 6:
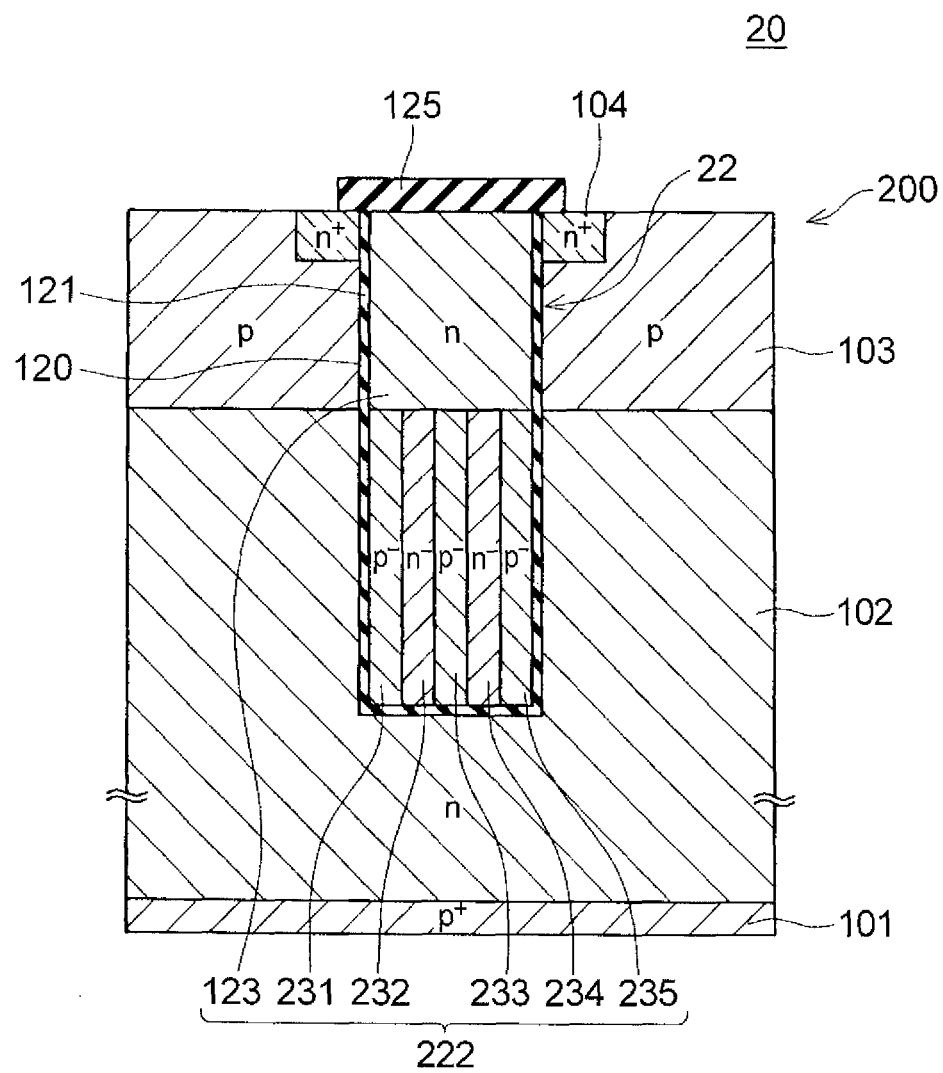
FIG. 6 is a sectional view of a semiconductor device in accordance with a modification in the invention.

Furthermore, the stacking direction of the p-layers and the n-layers does not need to be the depth direction of the semiconductor substrate. For example, as in a trench gate 22 of a semiconductor device 20 shown in FIG. 6, it is permissible that, in a region located at the drift layer 102 side of the boundary between the body layer 103 and the drift layer 102 of a semiconductor substrate 200, there be provided a gate electrode 222 that includes p-layers 231, 233 and 235 and n-layers 232 and 234 that are stacked or layered in a direction perpendicular to a longitudinal direction (the longitudinal direction of the trench 120 is a direction perpendicular to the sheet of FIG. 6) of the trench 120. Furthermore, similarly to the example described above with reference to FIGS. 4 and 5, in order to allow reverse bias voltage to be applied to the gate electrode 222 in a direction perpendicular to the longitudinal direction of the trench 120, for example, at least a portion of the p-layer 231 may extend to be exposed on the obverse surface of the semiconductor substrate 200, and may be connected to a wiring for applying a negative potential to the p-layer 231.

Figure 7:
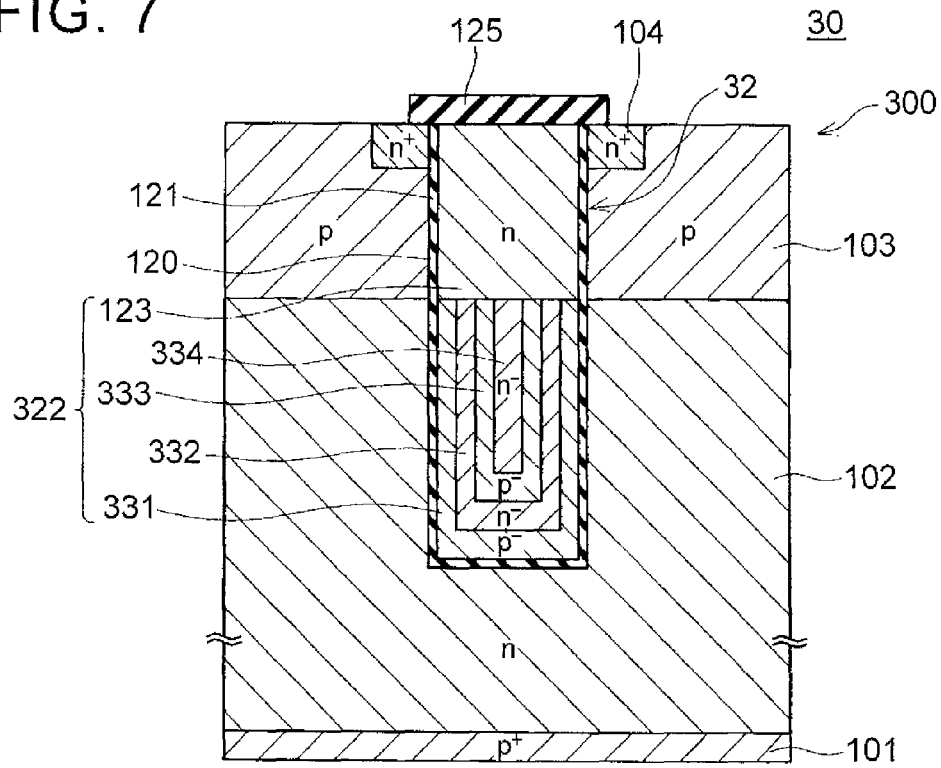
FIG. 7 is a sectional view of a semiconductor device in accordance with a modification in the invention.

Furthermore, as in a trench gate 32 of a semiconductor device 30 shown in FIG. 7, it is permissible that, in a region located at the drift layer 102 side of the boundary between the body layer 103 and the drift layer 102 of a semiconductor substrate 300, there be provided a gate electrode 322 in which a p-layer 331, an n-layer 332 and a p-layer 333 that have squared U shapes in a section perpendicular to the longitudinal direction of the trench 120 are layered in this order from the wall side of the trench 120 toward a center and in which a space on the inner side of the p-layer 333 is filled with an n-layer 334.

Figure 8:
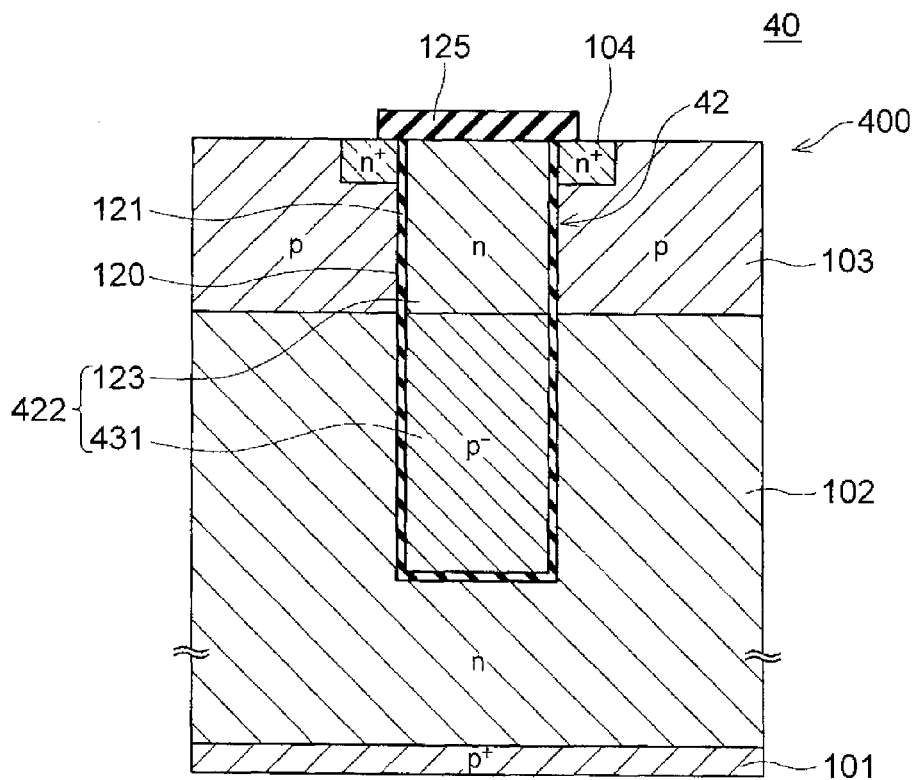
FIG. 8 is a sectional view of a semiconductor device in accordance with a modification in the invention.
Figure 9:
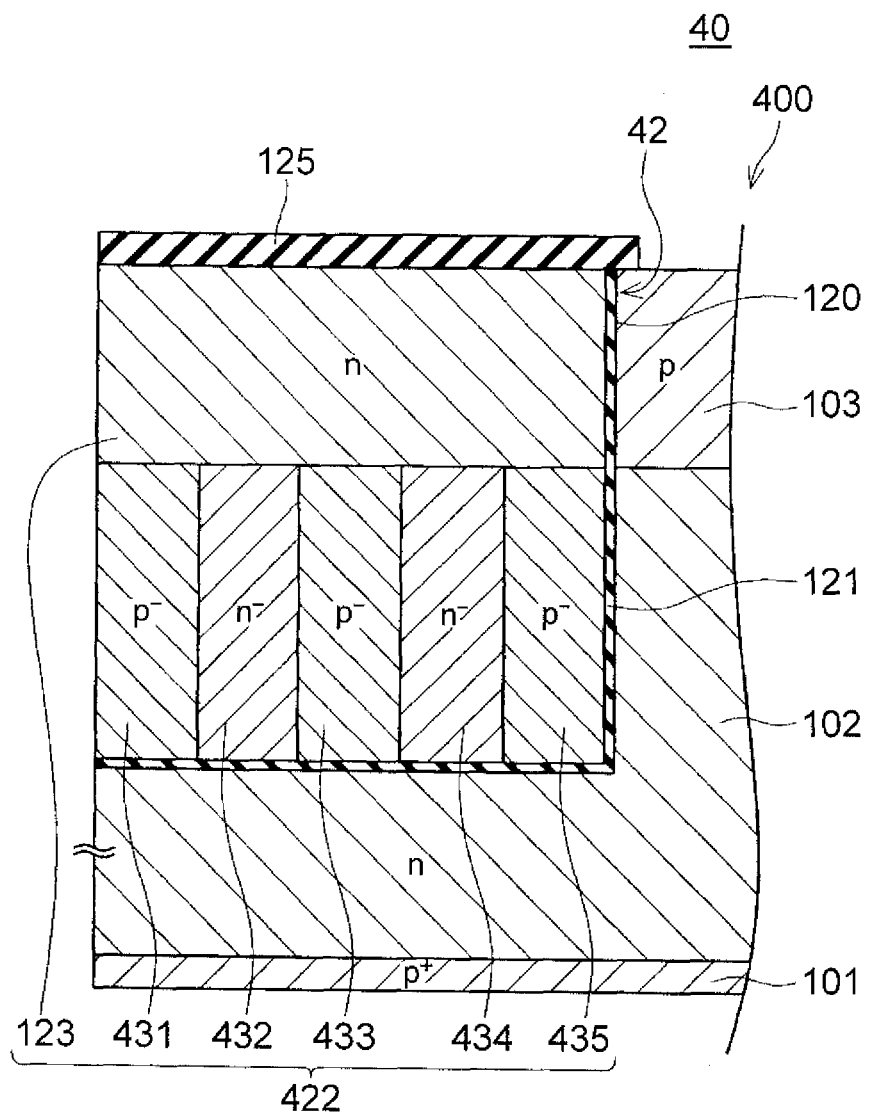
FIG. 9 is a sectional view of a semiconductor device in accordance with a modification in the invention.

Furthermore, as in a trench gate 42 of a semiconductor device 40 shown in FIGS. 8 and 9, it is permissible that, in a region located at the drift layer 102 side of the boundary between the body layer 103 and the drift layer 102 of a semiconductor substrate 400, there be provided a gate electrode 422 in which p-layers 431, 433 and 435 and n-layers 432 and 434 are alternately layered in the longitudinal direction of the trench 120. Furthermore, similarly to the example described above with reference to FIGS. 4 and 5, in order to allow reverse bias voltage to be applied to the gate electrode 422 in the longitudinal direction of the trench 120, for example, at least a portion of the p-layer 431 may extend to be exposed on the obverse surface of the semiconductor substrate 400 and may be connected to a wiring for applying a negative potential to the p-layer 431.

Furthermore, although in the foregoing embodiments, the region in the gate electrode which is located at the drift layer side of the boundary between the body layer and the drift layer includes only the first semiconductor layers and the second semiconductor layers that are alternately disposed and joined to each other, this is not restrictive. For example, a lower end of the n-layer 123 as shown in FIGS. 1 to 9 may extend to the drift layer 102 side beyond the boundary between the body layer 103 and the drift layer 102.

While the embodiments of the invention have been described in detail above, these embodiments are merely illustrative, and do not limit the scopes of the claims for patent. The technologies described in the claims include various modifications and alterations of the concrete examples illustrated above. In the invention, a construction in which "first semiconductor layer(s) and second semiconductor layer(s) are alternately disposed and joined to each other" includes a laminate of one first semiconductor layer and one second semiconductor layer.

The technical elements described in this specification or the accompanying drawings put forth the technical usefulness either by themselves or in various combinations. Furthermore, the technologies illustrated in the specification or the drawings are able to simultaneously accomplish a plurality of objects, and have technical usefulness merely by accomplishing one of the objects.

What is claimed is:

1. A semiconductor device comprising:
   a semiconductor substrate having a drift layer of a first conductivity type, a body layer of a second conductivity type formed on a surface of the drift layer, and a source layer formed on a portion of a surface of the body layer;
   a gate insulation film formed on an inner wall of a trench that extends from the surface of the semiconductor substrate through the source layer and the body layer to the drift layer; and
   a gate electrode housed in the trench and covered with the gate insulation film, the gate electrode including, in a region located at a drift layer side of a boundary between the body layer and the drift layer, at least one first semiconductor layer of the first conductivity type and at least one second semiconductor layer of the second conductivity type that are (1) alternately disposed, (2) joined to each other, and (3) in direct contact with each other.

2. The semiconductor device according to claim 1, further comprising
   a wiring for applying bias voltage, wherein
   the at least one first semiconductor layer and the at least one second semiconductor layer are alternately disposed in a depth direction of the trench, and
   the first semiconductor layer or the second semiconductor layer, which is disposed on a lowermost of the trench, is electrically connected to the wiring.

3. The semiconductor device according to claim 1, further comprising
   a wiring for applying bias voltage, wherein
   the at least one first semiconductor layer and the at least one second semiconductor layer are alternately disposed in a longitudinal direction of the trench, and
   the first semiconductor layer or the second semiconductor layer, which is disposed on an end in the longitudinal direction of the trench, is electrically connected to the wiring.

4. The semiconductor device according to claim 1, further comprising
   a wiring for applying bias voltage, wherein
   the at least one first semiconductor layer and the at least one second semiconductor layer are alternately disposed in a direction perpendicular to a longitudinal direction of the trench, and
   the first semiconductor layer or the second semiconductor layer, which is disposed on an end in the direction perpendicular to the longitudinal direction of the trench, is electrically connected to the wiring.

* * * * *